(12) United States Patent
Hujanen et al.

(10) Patent No.: US 7,220,669 B2
(45) Date of Patent: May 22, 2007

(54) THIN FILMS FOR MAGNETIC DEVICE

(75) Inventors: Juha Hujanen, Kauniainen (FI); Ivo Raaijmakers, Bilthoven (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/997,396

(22) Filed: Nov. 28, 2001

(65) Prior Publication Data
US 2002/0076837 A1 Jun. 20, 2002

Related U.S. Application Data

(60) Provisional application No. 60/250,533, filed on Nov. 30, 2000.

(51) Int. Cl.
*H01L 21/4763* (2006.01)

(52) U.S. Cl. ..................... 438/650; 438/686

(58) Field of Classification Search ............ 438/608, 438/650, 686–687; 324/252, 207.21; 360/103–104, 360/113; 257/E21.663, 21.208, E43.004, 257/E21.665, E21.463, E21.477, E21.495
See application file for complete search history.

(56) References Cited

U.S. PATENT DOCUMENTS

| | | | |
|---|---|---|---|
| 4,058,430 A | 11/1977 | Suntola et al. | 156/611 |
| 5,382,333 A | 1/1995 | Ando et al. | |
| 5,711,611 A | 1/1998 | Suntola et al. | 118/711 |
| 5,780,175 A * | 7/1998 | Chen et al. | 428/692 |
| 5,939,334 A | 8/1999 | Nguyen et al. | |
| 5,998,048 A * | 12/1999 | Jin et al. | 428/694 T |
| 6,006,763 A | 12/1999 | Mori et al. | |
| 6,143,658 A | 11/2000 | Donnelly et al. | |
| 6,144,060 A * | 11/2000 | Park et al. | 257/310 |
| 6,203,613 B1 * | 3/2001 | Gates et al. | 117/104 |
| 6,342,277 B1 | 1/2002 | Sherman | |
| 6,404,191 B2 * | 6/2002 | Daughton et al. | 324/252 |
| 6,478,931 B1 * | 11/2002 | Wadley et al. | 204/192.12 |
| 6,482,740 B2 | 11/2002 | Soininen et al. | |

(Continued)

FOREIGN PATENT DOCUMENTS

JP 62221102 9/1987

(Continued)

OTHER PUBLICATIONS

M. Utriainen et al., Studies of metalic thin film growth in an atomic layer epitaxy reactor using M (acac)2 (M= Ni, Cu, Pt) precursors) (Applied Surface Science 157 (2000) 151-158.*

(Continued)

*Primary Examiner*—David Vu
(74) *Attorney, Agent, or Firm*—Knobbe Martens Olson & Bear LLP (57) ABSTRACT

Methods are provided for forming uniformly thin layers in magnetic devices. Atomic layer deposition (ALD) can produce layers that are uniformly thick on an atomic scale. Magnetic tunnel junction dielectrics, for example, can be provided with perfect uniformity in thickness of 4 monolayers or less. Furthermore, conductive layers, including magnetic and non-magnetic layers, can be provided by ALD without spiking and other non-uniformity problems. The disclosed methods include forming metal oxide layers by multiple cycles of ALD and subsequently reducing the oxides to metal. The oxides tend to maintain more stable interfaces during formation.

39 Claims, 6 Drawing Sheets

U.S. PATENT DOCUMENTS

| | | | |
|---|---|---|---|
| 6,551,399 | B1* | 4/2003 | Sneh et al. ............... 117/102 |
| 6,617,173 | B1* | 9/2003 | Sneh ............................ 438/3 |
| 6,878,628 | B2 | 4/2005 | Sophie et al. |
| 2004/0038529 | A1 | 2/2004 | Soininen et al. |

FOREIGN PATENT DOCUMENTS

| | | |
|---|---|---|
| WO | WO 00/38191 | 6/2000 |
| WO | WO 01/88972 A1 | 5/2001 |
| WO | WO 02/09126 A2 | 7/2001 |
| WO | WO 02/09158 A2 | 7/2001 |
| WO | WO 01/88972 A1 | 11/2001 |

OTHER PUBLICATIONS

Yagishita et al., "Cleaning of Copper Surface Using Vapor-Phase Organic Acids," Materials Researching Society Spring 2003 Meeting, Symposium E, Session E, Paper E3.28.

Ueno et al., "Cleaning of CHF3 plasma-etched Si02/SiN/Cu via structures using a hydrogen plasma, an oxygen plasma, and hexafluoracetylacetone vapors," J. Vac. Sci. Technology B 16(6), pp. 2986-2995 (1998).

XP-002223616, "5th Asian Symposium on Information Storage Technology (ASIST), Hong Kong, China, Nov. 14-16", 2000.

Utriainen et al., "Studies of metallic thin film growth in an atomic layer epitaxy reactor using M(acac)$_2$ (M_Ni, Cu, Pt) precursors", Applied Surface Science, Apr. 2000.

Ritala et al., "Atomic layer epitaxy—a valuable tool for nanotechnology?" Nanotechnology 10 (1999), p. 19-24.

Oral presentation Chang-Wook Jeong (Seoul National University Center for Advanced Materials Res.) : "Thursday Nov. 16, 2000: Magnetoresistance of ferromagnetic tunneljunctions with A12O2 formed by Plasma-Assisted Atomic Layer Controlled Deposition" Presentation at 5th Asian SYmposium on Information Storage Technology (ASIST). Nov. 16, 2000.

Addison, C. C. et al., "The Vapour Pressure of Anhydrous Copper Nitrate, and its Molecular Weight in the Vapour State," *J. Chem. Soc.*, pp. 3099-3106 (1958).

Akerman, J. J. et al., "Identifying Tunneling in Ferromagnetic-Insulator-Ferromagnetic Thin Film Structures," World-wide web, physics.ucsd.eduiksgrp/Tunneling.html, pp. 1-6.

Bobo, J. F. et al., "Spin-dependent tunneling junctions with hard magnetic layer pinning," *Journal of Applied Physics*, vol. 83, No. 11, pp. 6685-6687 (1998).

Daughton, J. M., World-wide web nve.com/otherbiz/mram2.pdf, "Advanced MRAM Concepts," pp. 1-6 (Feb. 7, 2001).

Fereday, R. J. et al., "Anhydrous Cobalt (III) Nitrate," *Chemical Communications*, p. 271 (1968).

Imai, Takuji, World-wide.web nikkeibp.asiabiztech.com/nea/200008/tech_108675.html, "100 Gbit/Inch HDD Just Around the Corner," pp. 1-6 (Aug. 2000).

Nilsen, O. et al., "Thin film deposition of lanthanum manganite perovskite by the ALE process," *Journal of materials Chemistry*, vol. 9, pp. 1781-1784 (1999).

Pakrad, C. D., "Pure Tech: Growth of MR/GMR Head Materials," World-wide web, puretechinc.com/tech_papers/tech_papers-4.htm, pp. 1-2 (1999).

Suntola, *Handbook of Crystal Growth*, vol. 3, Thin films and epitaxy, Part B: Growth mechanisms and dynamics, Chapter 14, pp. 601-663, Hurle, ed. Elsevier Science B.V. (1994).

Wang, Shan X., "Advanced materials for Extremely High Density Magnetic Recording Heads," Department of Materials Science and Engineering, Department of Electrical Engineering, Stanford University, Stanford, CA 94305-4045, presentation.

World-wide web megahaus.com/tech/westerndigital/shitepapers/gmr_wp.shtml, "GMR Head Technology: Increased Areal Density and Improved Performance Areal Density," pp. 1-4 (Feb. 2000).

World-wide web semiconductor.net/semiconductor/issues/Issues/1998/feb98/docs/emerging.asp, "GMR Read-Write Heads Yield Data Storage Record," pp. 1-2 (Feb. 1998).

World-wide web stoner.leeds.ac.uk/research/gmr.htm, "Giant Magnetoresistance," pp. 1-6.

World-wide web, pc.guide.com/ref/hdd/op/heads/techGMR-c.html, "Giant Magnetoresistive (GMR) Heads," pp. 1-4.

* cited by examiner

THIN FILMS FOR MAGNETIC DEVICE

RELATED APPLICATIONS

The present application claims priority under 35 U.S.C. §119(e) to provisional application No. 60/250,533, filed Nov. 30, 2000.

FIELD OF THE INVENTION

This invention relates to magnetic structures for semiconductor devices and, more particularly, to a method for forming such structures by depositing thin films using atomic layer deposition (ALD). The magnetic structures may find use in magnetic random access memories (MRAMs) or in the magnetic field sensing elements that can be used in read-heads of computer hard-disk drives.

BACKGROUND OF THE INVENTION

Magnetic structures in integrated circuits and hard-disk read-heads include multi-layer devices comprising ferromagnetic films, conductive films and insulation films. These layered magnetic structures include magnetic tunneling junctions, spin-valve transistors and pseudo spin valves.

Most commonly, physical vapor deposition (PVD) and chemical vapor deposition (CVD) processes are used for deposition of these films. There are problems associated with these techniques; pinholes, film thickness non-uniformity and impurities at the film interfaces have caused devices to fail. For example, PVD results in three-dimensional growth of cobalt into islands on aluminum oxide, rather than two-dimensional film growth. In addition, ferromagnetic metals are rather sensitive to corrosion and thus require very careful treatment.

The problem of thickness non-uniformity can be mitigated using a chemical-mechanical polishing technique (CMP). A CMP technique for making a magnetic structure has been described in patent application WO 00/38191, published Jun. 29, 2000. Unfortunately, CMP causes oxidation of some ferromagnetic materials. The oxygen must be removed and the film restored to elemental metal. This reduction reaction should be effected at a low temperature (e.g., less than about 300° C.), as high temperatures can destroy the functionality of the device.

Magnetic random access memories (MRAMs) have many desirable properties. The magnetic polarity of the soft magnetic layer can be switched very quickly, in as little as a nanosecond. The MRAM cells can be packed close together; they can be scaled down to densities used for state-of-the-art DRAMs (dynamic random access memories). MRAM fabrication requires fewer mask steps than DRAM fabrication, thus simplifying production and saving time and costs. In addition, the MRAM is non-volatile. Unlike the DRAM, it is not necessary to supply the MRAM with continuous or periodic power. Once data has been written to the MRAM cell it will remain until it is rewritten and needs no additional power. Thus, it is expected that MRAMs have the potential to replace DRAMs, static RAMs (SRAM) and flash memory in a wide range of applications, such as cell phones, MP3 players, personal digital assistants (PDAs) and portable computers. The manufacturing of magnetic central processing units (MCPU) will also be feasible. MCPUs can be reprogrammed on the fly to match any specific task. Before this can happen, however, the remaining manufacturing problems of MRAM structures must be solved.

One form of a basic MRAM cell comprises a single current-sensing element and a three-layer magnetically functional sandwich. These cells are written to and read via current passing through adjacent conducting lines. In the sandwich a very thin, insulating or "tunnel dielectric" layer separates two magnetic layers. One of the magnetic layers is "soft," which means that relatively small magnetic fields can change the magnetic polarity of the material, i.e., the material has low coercivity. The other magnetic layer is "hard," which means that the polarity of the material changes only under the influence of a relatively large magnetic field, i.e., the layer has high coercivity. The magnetic fields associated with writing and reading currents in the conducting lines cannot change the magnetic polarity of the "hard" magnetic layer. Data is written to the soft magnetic layer of the sandwich by passing a current through two conductor lines that are electrically connected to the magnetic layers.

A single bit of data can be read from the sandwich by using an address line connected to one of the conductor lines. The address line can turn on a sense transistor, depending on the current level that tunnels through the magnetic sandwich. The level of the tunneling current depends on the polarity of the magnetic layers in the sandwich. When the polarity of the magnetic layers is parallel, higher current tunnels through the sandwich than when the polarity of the magnetic layers is antiparallel.

In the MRAM cell, the thickness of the insulating layer in the sandwich is in the nanometer range. The strength of the tunneling current through the insulator is very sensitive to the thickness of the insulator. For example, aluminum oxide insulating thin films may be just four atomic layers thick. Changing the thickness of the insulator by only a tenth of a nanometer may change the tunneling current by an order of magnitude. In addition, the insulator must have high dielectric strength to withstand the operating voltages and provide sufficient tunneling current.

MRAM structures are also sensitive to pinholes in the layers. These can short-out the magnetic memory cell, rendering the device non-functional. The MRAM layers are also temperature sensitive; defects can be expected if the layers are exposed to excessively high temperatures.

The tunneling dielectric can be made, for example, by plasma oxidizing an aluminum metal layer into aluminum oxide. Low surface diffusion of atoms prevents formation of islands and pinholes.

Spin-valve transistors are used as magnetic field sensors. Read-heads for hard-disks and MRAMs can comprise spin-valve transistors.

In a typical spin-valve transistor structure (Si collector/Co/Cu/Co/Pt/Si emitter), Co and Cu layers are deposited by sputtering. The optimum thickness of the Cu layer is about 2.0–2.4 nm. Improved flatness of the Co/Cu interface increases the magnetoresistance effect, which is desirable. The scattering probability of the hot electrons in the base is altered by a magnetic field.

SUMMARY OF THE INVENTION

According to a first aspect of the invention, magnetic structures comprising very thin films are fabricated utilizing atomic layer deposition (ALD). In one embodiment, a tunnel dielectric for a magnetic tunnel junction is formed by ALD. In another embodiment, thin metal films for magnetic devices are fabricated by ALD, such as by utilizing alternated metal source and hydrogen-rich plasma gases. In still another arrangement, thin metal films for magnetic devices are fabricated by depositing metal oxide thin films by multiple ALD cycles, followed by reduction of the metal oxide to a metal state.

These methods ensure near perfect uniformity in magnetic and non-magnetic conductors, and suppress migration that can cause spiking. In magnetic tunnel junction devices, dielectric layers of perfect uniformity allows optimal thickness, avoiding leakage current while keeping the layers thin enough to allow sensitivity for tunneling.

DETAILED DESCRIPTION OF THE PREFERRED EMBODIMENT

The present invention generally involves improvements in the fabrication of magnetic devices. The methods described herein may find use, for example, in the formation of magnetic structures in memory cells (e.g., MRAMs) and the sensing elements of read-heads.

Magnetic Tunnel Junctions

Figure 1:
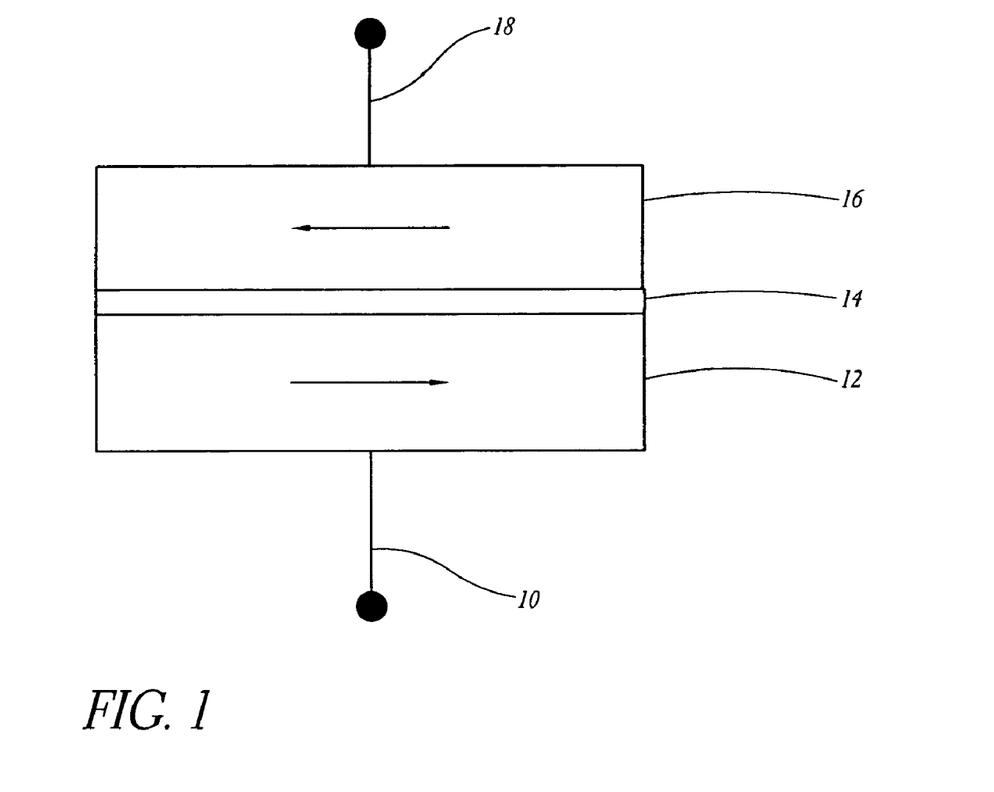
FIG. 1 is a schematic cross section depicting the basic structure of a magnetic tunneling junction (MTJ) cell.

FIG. 1, illustrates an integrated circuit device, and more particularly the magnetic tunnel junction (MTJ) of a magnetic random access memory (MRAM) cell. The device includes two conductors, comprising ferromagnetic layers 12 and 16, and an insulator 14 therebetween. Lines 10 and 18 represent electrodes on either side of the junction. The insulator 14 serves as a tunneling dielectric layer 14 of the MTJ, sandwiched between a hard ferromagnetic layer 12 and a soft ferromagnetic layer 16.

Figure 2:
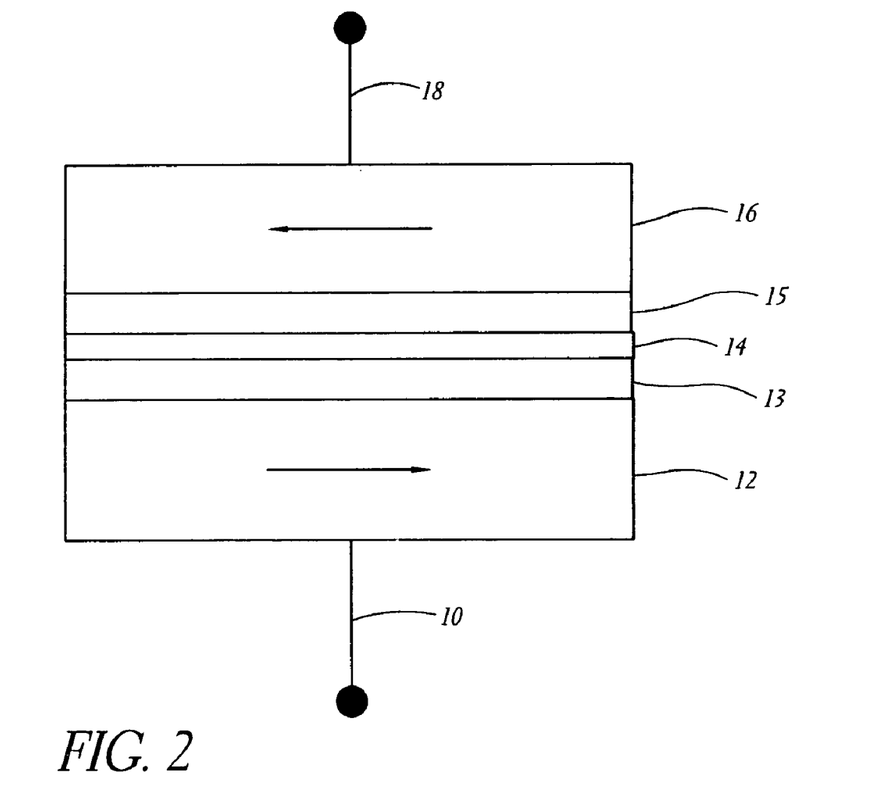
FIG. 2 is a schematic cross section depicting the structure of a magnetic tunneling cell, similar to that of FIG. 1, with additional layers that cause an increased magnetic resistance effect.

FIG. 2 illustrates another example of an MRAM MTJ. In the illustrated embodiment, the device additionally includes layers 13 and 15, which are conductors formed of a non-magnetic metal. In the illustrated embodiments layers 13 and 15 comprise copper.

Exemplary ALD processes are set forth hereinbelow, providing processes for forming the dielectric 14, the hard 14 and soft 16 magnetic layers and the non-magnetic layers 13 and 15.

Al$_2$O$_3$ seems to be the best tunneling dielectric film so far. However, it has also been possible to deposit other dielectrics, such as SiO$_2$, Y$_2$O$_3$, La$_2$O$_3$, ZrO$_2$, HfO$_2$ and Ta$_2$O$_5$, by the ALD method.

As a further benefit of the ALD process, deposition of aluminum oxide by ALD onto a ferromagnetic metal surface does not oxidize the ferromagnetic metal.

Formation of Magnetic Tunnel Junctions by Metal Oxide Deposition and Reduction

According to one aspect of the invention, the following process steps are executed during the manufacturing of magnetic tunnel junctions.

A substrate comprising a hard magnetic material is provided. The substrate surface is cleaned first by sputter-etching or by treatment with hydrogen-rich radicals, alcohols, aldehydes or carboxylic acids to eliminate any surface oxide in preparation for atomic layer deposition (ALD). Optionally, the cleaned metal layer may be treated prior to deposition of metal oxide to ensure the subsequent formation of a uniform metal oxide layer by ALD on the substrate.

A first layer of metal oxide, such as cobalt oxide or copper oxide, is deposited, preferably by multiple cycles of ALD, onto the substrate. This first metal oxide layer is then reduced to elemental metal. A thin tunneling dielectric layer, such as Al$_2$O$_3$, is deposited, preferably by ALD. A second metal oxide layer, such as cobalt oxide or copper oxide, is deposited over the dielectric layer, preferably by multiple cycles of ALD. The second metal oxide layer is then reduced to elemental metal.

Figure 6:
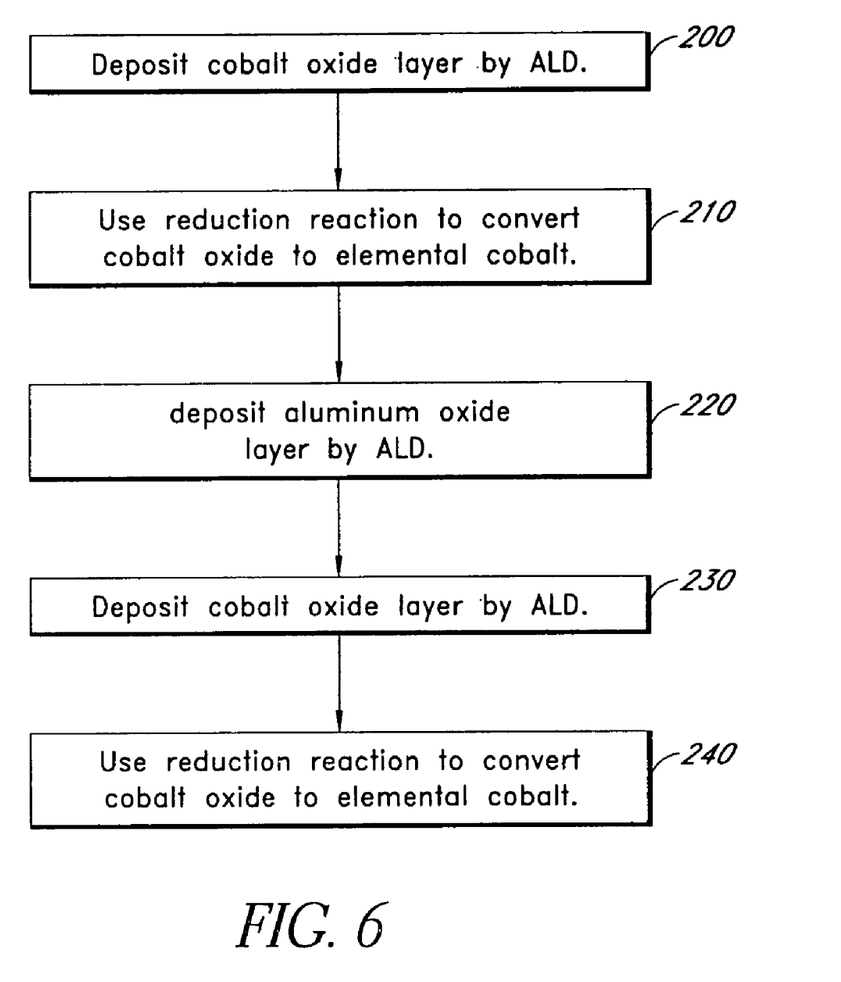
FIG. 6 is a flow chart depicting a process for depositing a Co/Al$_2$O$_3$/Co structure by ALD.

An exemplary ALD process is illustrated in FIG. 6. A cobalt oxide layer is deposited by ALD 200 and then reduced to elemental cobalt in a reduction reaction 210. An aluminum oxide layer is then deposited by ALD 220. Next a second cobalt oxide layer is deposited by ALD 230 over the aluminum oxide layer and reduced to elemental cobalt 240.

The formation of elemental metal layers by depositing a metal oxide and then reducing the metal oxide is beneficial to the formation of magnetic devices. The reduced mobility of the metal atoms in the oxide lowers the probability of island formation in the thin film during deposition and provides for more uniform film growth.

Formation of Magnetic Tunnel Junctions by Metal Deposition

Metal thin films can also be grown directly by ALD from alternating pulses of volatile metal source chemicals and reducing agents. Preferably, the reducing phase is a very strong reducer, preferably rich in hydrogen radicals. Hydrogen-rich radicals can be produced, for example, using an in situ plasma and more preferably a remote plasma source.

It is acceptable for the electrical resistance of a magnetic tunnel junction (MTJ) to be quite high, so it is also possible to use semi-metallic ferromagnetic materials for the ferromagnetic layers in magnetic tunnel junctions. Materials such as Fe$_3$O$_4$ (magnetite), CrO$_2$, and manganite perovskites, which are preferably doped with alkaline earth metals, can be deposited by ALD and used in MTJ's instead of elemental ferromagnetic metals. Suitable processes are discussed in "Thin film deposition of lanthanum manganite perovskite by the ALE process", O. Nilsen, M. Peussa, H. Fjellvåg, L. Niinistö and A. Kjekshus, *J. Mater. Chem.* 9 (1999) 1781–1784, which is incorporated by reference herein.

ALD is a perfect tool for constructing unique magnetic metal oxide superlattices for use in magnetic tunnel junctions.

Spin Valve Transistor

Figure 4:
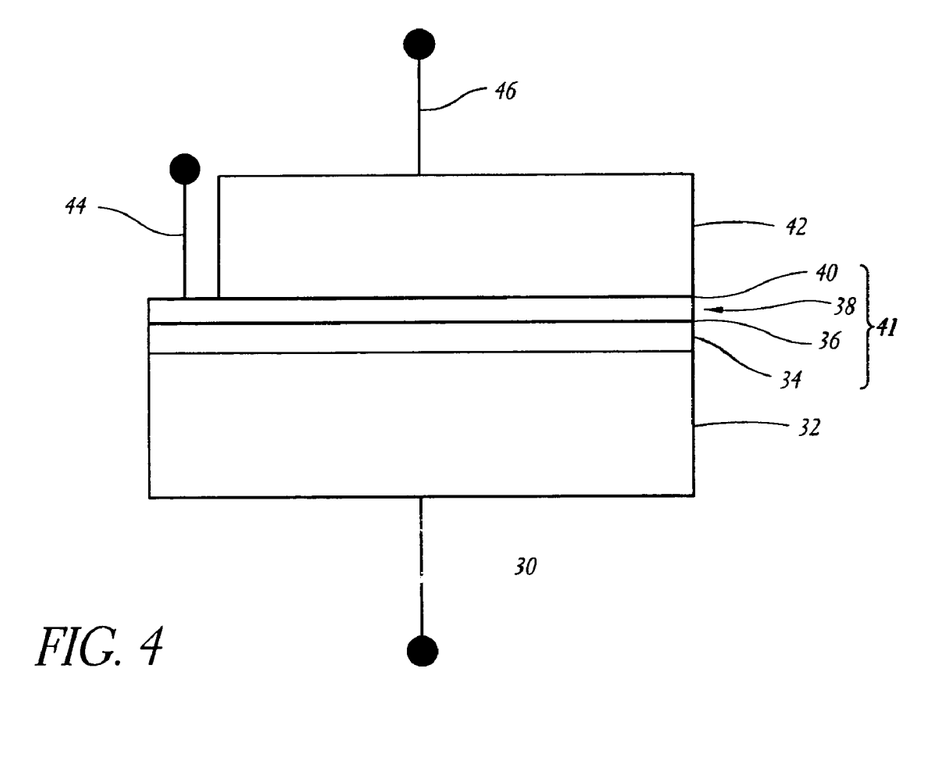
FIG. 4 is a schematic cross-sectional drawing of a spin-valve transistor.

With reference to FIG. 4, a spin-valve transistor is shown in cross section. Electrical contacts are made to the transistor through leads 30, 44 and 46. Electrons are injected from a silicon emitter 42 into an exemplary base stack 41 that consists of four layers: platinum 40, cobalt 38, copper 36 and cobalt 34. Electrons pass from the emitter 42, through the base stack and into the silicon collector 32 to form the collector current. The semiconductor-metal interfaces, 42/40, 34/32 are Schottky barriers. The exemplary base stack Pt/Co/Cu/Co 41 has a total thickness of about 10 nm and, in the prior art, is usually deposited by sputtering. This stack 41 forms the base of the transistor. One or more of the four layers of the stack 41 may be deposited by ALD.

Spin Valve Transistor Formation

The metal layers of the base stack 41 of the spin-valve transistor can be deposited by plasma-enhanced atomic layer deposition (ALD) from alternating vapor phase pulses of metal source chemicals and hydrogen plasma.

Figure 5:
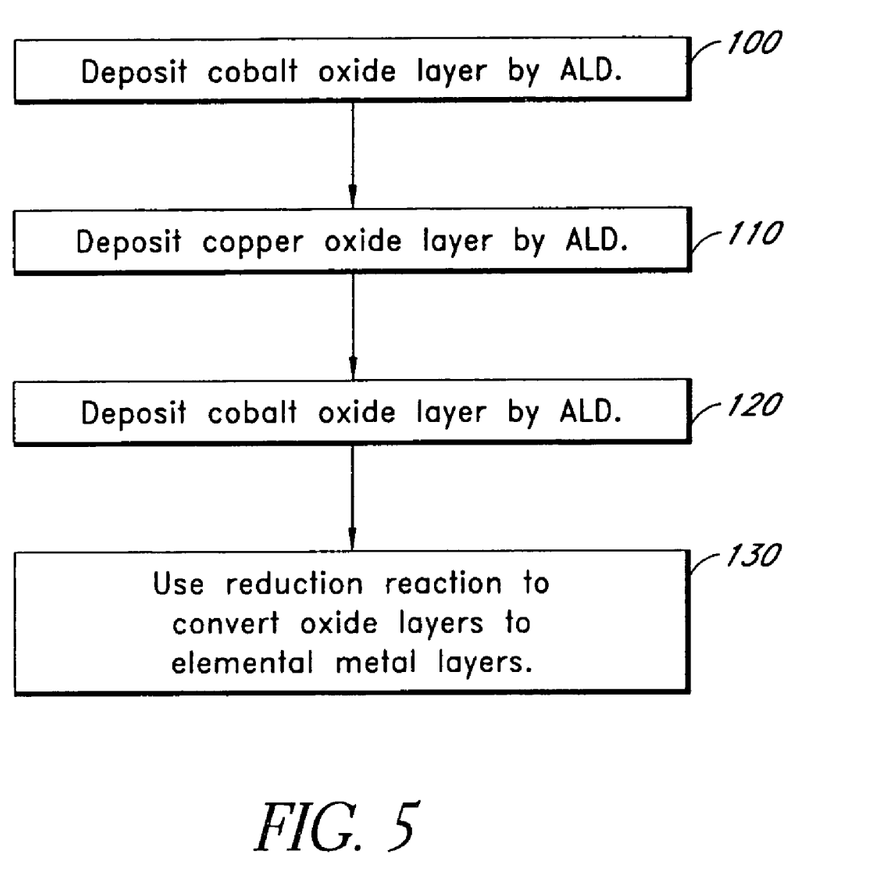
FIG. 5 is a flow chart depicting a process for depositing a Co/Cu/Co structure by ALD.

More preferably, the magnetic layers 34, 38 and conductive layer 36 of the base stack 41 are deposited in the form of metal oxides by ALD, in accordance with the process of FIG. 5, steps 100 to 130.

As an option, a platinum oxide or cobalt-platinum oxide layer can also be deposited by ALD on top of the second cobalt oxide layer. Subsequently, these metal oxide layers are chemically reduced to elemental metal layers with a reducing agent that is selected from the group consisting of, but not limited to, hydrogen, activated hydrogen, carbon monoxide, alcohols, aldehydes and carboxylic acids. Preferably, strong organic reducing agents are employed. The thickness of the metal oxide thin film decreases about 30–50% when oxygen is removed from the film during the reduction process.

A substrate with a patterned doped silicon surface, that will form a collector of electrons 32, is provided to the reaction chamber of an ALD reactor. A first cobalt oxide layer is deposited 100 on the substrate from multiple cycles of alternate pulses of a cobalt source chemical and an oxygen source chemical. Copper oxide is deposited 110 on the cobalt oxide surface from multiple cycles of alternating pulses of a copper source chemical and an oxygen source chemical. A second cobalt oxide layer is deposited 120 over the copper oxide from multiple cycles of alternate pulses of a cobalt source chemical and an oxygen source chemical.

The oxides can be reduced 130 into metals using, for example, alcohols (e.g. ethanol), aldehydes (e.g. formaldehyde) or carboxylic acids (e.g. formic acid). The substrate with the oxide layers is placed in a reaction space that is subsequently evacuated. The reducing agent is vaporized and fed into the reaction space, optionally with the aid of an inert carrier gas, such as nitrogen. The reducing agent reacts with the oxide layers whereby the oxide trilayer structure, cobalt oxide/copper oxide/cobalt oxide, is chemically reduced to an elemental trilayer structure, Co/Cu/Co. Typically, the reaction space is then purged with an inert carrier gas to remove the unreacted organic reducing agent and reaction products.

The reduction process can be carried out in a wide temperature range, even as low as room temperature. The temperature in the reaction space is typically in the range of 250° C. to 400° C., preferably 300° C. to 400° C. and more preferably 310° C. to 390° C. The pressure in the reaction space is typically 0.01 mbar to 20 mbar. The processing time varies according to the thickness of the layer to be reduced. A layer of copper oxide having a thickness up to 400 nm can be reduced in approximately 3 to 5 minutes. For layers having a thickness of 0.1 nm to 10 nm, the processing time is on the order of seconds. Typically, oxide layer thickness decreases about 30% upon reduction to elemental metal.

To prevent reoxidation of the exposed cobalt top surface, the reduction is preferably done in the same reactor and just before deposition of the platinum metal. If reoxidation does occur, a subsequent reduction treatment using volatile organic compounds such as alcohols, aldehydes or carboxylic acids can be performed.

One benefit of depositing oxide films and later reducing the films to elemental form is that the mobility of the metal atoms is decreased in the oxide form. This lowers the probability of island formation in the thin film during deposition and ensures uniform two-dimensional film growth. Copper atoms, especially, have a tendency for high surface mobility even at room temperature.

Pseudo-Spin Valve

According to another embodiment of the present invention one or more layers in a pseudo-spin valve (not shown) can be constructed by the methods described herein. In a pseudo-spin valve, the first ferromagnetic layer is magnetically softer than the second ferromagnetic layer. A bit of information is stored in the first ferromagnetic layer and the second ferromagnetic layer helps to read the state of the first ferromagnetic layer. High-enough current will switch the magnetic orientation of the first ferromagnetic layer, thus changing the stored one-bit information from 1 to 0 or 0 to 1. The operation of the pseudo-spin valve has been described in Scientific American, "In Focus: The Magnetic Attraction", May 1999, the disclosure of which is included herein by reference.

The first ferromagnetic (FM) layer can be made magnetically softer than the second FM layer by using a different material that has higher coercivity than the second FM layer. An example of this differing-material structure is NiFe (first FM)/conductor/Co (second FM). The cobalt layer can be pinned, for example with a $Co_{81}Pt_{19}$ alloy layer. Another possibility is to make both ferromagnetic layers of the same material, but make the first FM layer thinner than the second one. An example of this differing-thickness structure is thin Co (first FM)/conductor/thick Co (second FM). In both cases a conductive layer separates the ferromagnetic layers. An exemplary material for the conductive layer is copper. In another arrangement the first ferromagnetic layer can be made harder than the second ferromagnetic layer.

Pseudo Spin Valve Formation by Metal Deposition

According to a first embodiment of the invention, the pseudo-spin valve sandwich is formed by ALD with the use of metal source gases and hydrogen-rich radicals. The basic atomic layer deposition of each layer in the sandwich comprises the following steps:

(1) Metal source chemical vapor is introduced into the reaction space and makes contact with the substrate surface.

(2) Surplus metal source chemical and reaction by-products are purged from the reaction space by pumping and/or by flowing an inactive gas (e.g. nitrogen).

(3) Hydrogen-rich chemical plasma is introduced into the reaction space and makes contact with the substrate surface.

(4) Surplus hydrogen-rich chemical plasma and reaction by-products are purged from the reaction space by pumping and/or by flowing inactive gas (e.g. nitrogen).

When a layer containing only one metal is required, the four steps are repeated until the metal film reaches the desired thickness. As an example, a Co metal thin film is grown by ALD from volatile compounds of cobalt and hydrogen plasma. The cobalt compound self-limitingly adsorbs no more than about one monolayer of cobalt species on the substrate, while the hydrogen plasma reduces the adsorbed species to elemental metal.

When a layer containing a binary alloy is required, the four steps are repeated alternately with a first metal source gas and a second metal source gas until the alloy film reaches the desired thickness.

As a non-limiting example, the completed sandwich may contain 6 nm NiFe/5 nm Cu/6 nm Co. As another, non-limiting example, the completed sandwich may contain 6 nm Co/5 nm Cu/20 nm Co.

Benefits of these ALD processes include the fact that all the process steps can be done at low substrate temperatures and the control over the thin film thickness uniformity is excellent.

Pseudo Spin Valve Formation by Deposition of Metal Oxide Followed by Reduction

In accordance with another embodiment of the invention, metal oxides are first deposited, preferably by multiples cycles of ALD, and then these metal oxide layers are reduced into elemental metal layers. In this case, atomic layer deposition of each layer in the sandwich comprises a cycle of the following steps:

(1) Metal source chemical vapor is introduced into the reaction space and makes contact with the substrate surface.
(2) Surplus metal source chemical and reaction by-products are purged from the reaction space by pumping and/or by flowing an inactive gas (e.g. nitrogen).
(3) Oxygen source chemical is introduced into the reaction space and makes contact with the substrate surface.
(4) Surplus oxygen source chemical and reaction by-products are purged from the reaction space by pumping and/or by flowing an inactive gas (e.g. nitrogen).

These four steps are repeated for many cycles until a metal oxide thin film of desired thickness is formed. As an example, a cobalt oxide thin film is grown by ALD from volatile compounds of cobalt (e.g. $Co(thd)_3$) and volatile or gaseous oxygen compounds (e.g. ozone).

After finishing the ALD processing, there are metal oxide layers on the substrate surface. As a non-limiting example, the layers may contain 9 nm cobalt oxide/8 nm copper oxide/25 nm cobalt oxide. The oxide stack can be reduced into an elemental metal stack (cobalt/copper/cobalt) in one step. Hydrogen gas, hydrogen-rich plasma, carbon monoxide, alcohols, aldehydes and some carboxylic acids can be used, for example, as reducing agents to effect the transformation.

One benefit of this "metals from metal oxide" process is that the surface mobility of metal atoms is reduced when they are bound to oxygen. This decreases the chances of agglomeration and island formation during deposition and helps to ensure thickness uniformity and consistency in the thin-film growth. In the as-deposited structure, the oxide layers are separate and distinct from one another with planar interfaces in between. Another benefit of this "metals from metal oxide" process is that the deposition steps and the reducing steps can be performed at low temperatures, e.g., less than 300° C., which is desirable in integrated circuit fabrication. ALD provides excellent control over the thin film thickness uniformity.

The Deposition Process

For the purpose of the present invention, an atomic layer deposition (ALD) process, also known as atomic layer epitaxy (ALE), designates a process where the deposition of a thin film onto a substrate is based on sequential and alternating self-saturating surface reactions from at least two separate gaseous source chemicals. Temperatures are arranged to be above the condensation points and below the thermal decomposition points for the source chemicals. The principles of ALD are disclosed, for example, in U.S. Pat. Nos. 4,058,430 and 5,711,811, the disclosures of which are incorporated herein by reference. A thorough description of the ALD process can be found in "Atomic Layer Epitaxy" by Dr. Tuomo Suntola, *Handbook of Crystal Growth* vol. 3, Thin films and Epitaxy, Part B: Growth Mechanisms and Dynamics, Chapter 14, pp. 601–663, Edited by D. T. J. Hurle, Elsevier Science B. V., 1994, the disclosure of which is included herein by reference.

Figure 3:
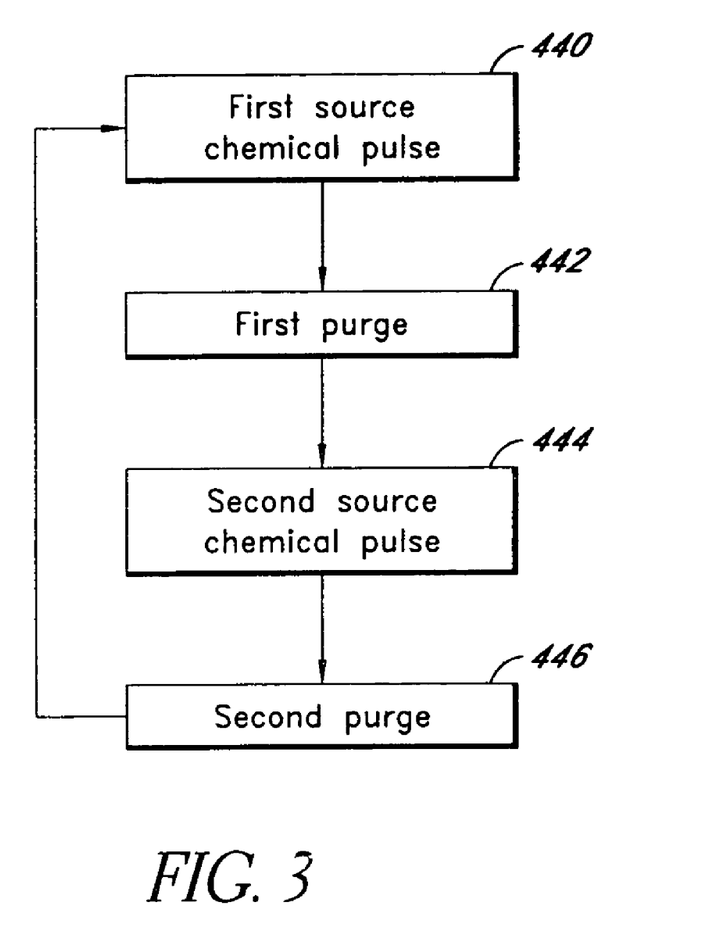
FIG. 3 is a flow chart showing the basic pulsing sequence used for a two-phase atomic layer deposition (ALD) process.

FIG. 3 depicts a basic two-phase process for atomic layer deposition. Source chemical pulses 440 and 444 are separated from one another in time and space by purge periods 442 and 446. Alternatively, the purge periods can be replaced by evacuation of the chamber to remove byproduct and excess reactant between source chemical pulses 440, 444. Importantly, each pulse preferably has a self-limiting effect, leaving no more than about one molecular monolayer of material per cycle. Typically, the metal source chemicals include ligands that self-terminate adsorption of a monolayer or partial monolayer.

The Source Materials

ALD requires thermally stable source chemicals that have high-enough vapor pressure at the source temperature (preferably 200° C. to 400° C., 300° C. in the illustrated embodiments). Sufficiently high vapor pressure of the source chemical is around 0.01–0.1 mbar. Higher vapor pressure can decrease the required minimum pulse time of the source chemical and make the process faster.

Metal Source Materials

Volatile aluminum source chemicals are selected from the group consisting of, but not limited to, alkyl aluminums (e.g. trimethyl aluminum TMA), aluminum alkoxides (e.g. aluminum isopropoxide ($Al(O^iPr)_3$)), aluminum beta-diketonates (e.g. $Al(thd)_3$) and anhydrous aluminum nitrate ($Al(NO_3)_3$).

Volatile copper compounds are selected from the group consisting of, but not limited to, $Cu(thd)_2$, $Cu(acac)_2$, $Cu(hfac)_2$, CuCl, CuBr, CuI and anhydrous copper nitrate ($Cu(NO_3)_2$). Anhydrous $Cu(NO_3)_2$ has not been commercially available but it can easily be synthesized from copper metal and dinitrogen tetroxide in anhydrous ethyl acetate. The synthesis has been described by C. C. Addison and B. J. Hathaway, "The Vapor Pressure of Anhydrous Copper Nitrate, and its Molecular Weight in the Vapor State", J. Chem. Soc. 1958 pp. 3099–3106, the disclosure of which is included herein by reference.

Volatile cobalt compounds are selected from the group consisting of, but not limited to, tris(2,2,6,6-tetramethyl-3,5-heptanedionato)cobalt ($Co(thd)_3$), $Co(acac)_3$, cobalt tricarbonyl nitrosyl ($Co(CO)_3NO$), cyclopentadienylcobalt dicarbonyl ($C_5H_5Co(CO)_2$) and anhydrous cobalt nitrate ($Co(NO_3)_3$). Anhydrous cobalt nitrate ($Co(NO_3)_3$) has not been commercially available but it can be synthesized, e.g., according to the instruction published by R. J. Fereday, N. Logan and D. Sutton, "Anhydrous cobalt(III) nitrate", Chem. Commun. 1968, pp. 271, the disclosure of which is included herein by reference.

Volatile iron compounds are selected from the group consisting of, but not limited to, tris(2,2,6,6-tetramethyl-3,5-heptanedionato)iron ($Fe(thd)_3$), bis(cyclopentadienyl)iron (($C_5H_5)_2Fe$) and its alkyl derivatives, iron (III) acetylacetonate ($Fe(CH_3COCHCOCH_3)_3$), iron (III) chloride ($FeCl_3$) and iron pentacarbonyl ($Fe(CO)_5$).

Volatile chromium compounds are selected from the group consisting of, but not limited to, tris(2,2,6,6-tetramethyl-3,5-heptanedionato)chromium ($Cr(thd)_3$), chromyl chloride ($CrO_2Cl_2$), bis(cyclopentadienyl)chromium (($C_5H_5)_2Cr$) and its alkyl derivatives, bis(ethylbenzene)chromium, chromium (III) acetylacetonate ($Cr(CH_3COCHCOCH_3)_3$) and chromium hexacarbonyl ($Cr(CO)_6$).

Volatile nickel compounds are selected from the group consisting of, but not limited to, bis(2,2,6,6-tetramethyl-3, 5-heptanedionato)nickel (Ni(thd)$_2$), nickel carbonyl (Ni(CO)$_4$), nickel (II) hexafluoroacetylacetonate, bis(cyclopentadienyl)nickel ((C$_5$H$_5$)$_2$Ni) and its alkyl derivatives and tetrakis(trifluorophosphine)nickel (0) (Ni(PF$_3$)$_4$).

Oxygen Source Materials

Gaseous or volatile oxygen source chemicals can be selected from the group consisting of, but not limited to, oxygen, ozone, water, hydrogen peroxide, peroxy acids (e.g. CH$_3$COOOH), and oxygen radicals.

Post ALD Reducing Agents

As used herein, the terms "reduction" and "reducing" refer to the removal of oxygen atoms from a metal layer. "Reduction" does not have to be complete reduction and some oxygen atoms may remain in a metal layer after it has been reduced. Thus a metal layer that is "reduced" or "at least partially reduced" is a metal layer from which some, but not necessarily all oxygen atoms have been removed. Further, an "elemental metal" that is formed by "reduction" of a metal oxide is a metal layer from which most oxygen atoms have been removed. However, it is understood that an elemental metal layer may contain some residual or contaminant oxygen atoms.

Reducing agents can be selected from, but are not limited to, the following: hydrogen, hydrogen-rich radicals, carbon monoxide, alcohol vapor, aldehyde vapor and carboxylic acid vapor.

In one embodiment metal oxide is reduced with hydrogen plasma. Briefly, the substrate comprising the metal oxide layer is placed in a reaction chamber. A gas mixture comprising hydrogen is allowed to flow into the reaction chamber and Radio Frequency (RF) power is applied to create a plasma discharge in the hydrogen gas. The plasma discharge etches the metal oxide, leaving elemental metal.

In another embodiment metal oxide layers are reduced with one or more organic reducing agents. Preferably the organic reducing agents have at least one functional group selected from the group consisting of alcohol, aldehyde and carboxylic acid.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom that is bonded to another carbon atom, in particular primary alcohols according to the general formula (I):

$$R^1\text{—OH} \tag{I}$$

wherein $R^1$ is a linear or branched $C_1$–$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

wherein each $R^1$ is selected independently from the group of linear or branched $C_1$–$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

wherein each $R^1$ is selected independently from the group of linear or branched $C_1$–$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5–6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}\text{—}R^2\text{—OH} \tag{IV}$$

wherein X is selected from the group consisting of F, Cl, Br and I, n is an integer from 0 to 2 and $R^2$ is selected from the group of linear or branched $C_1$–$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3\text{—CHO} \tag{V}$$

wherein $R^3$ is selected from the group consisting of hydrogen and linear or branched $C_1$–$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC\text{—}R^4\text{—CHO} \tag{VI}$$

wherein $R^4$ is a linear or branched $C_1$–$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5\text{—COOH} \tag{VII}$$

wherein $R^5$ is hydrogen or linear or branched $C_1$–$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

EXAMPLE 1

The Deposition of Aluminum Oxide by ALD

A substrate was loaded into a reactor configured for ALD processing. The reaction space was evacuated with a vacuum pump. After the evacuation, the pressure of the reaction space was adjusted to about 5–10 mbar (absolute) with flowing nitrogen gas that had a purity of 99.9999%. Then the reaction chamber was allowed to stabilize at 300° C. Alternating pulses of trimethyl aluminum (TMA) and water were introduced into the reaction space and made contact with the substrate surface. The reaction space was purged with nitrogen gas between the alternating pulses.

The growth rate of the amorphous $Al_2O_3$ film was 0.11 nm/cycle. The thickness variation of an aluminum oxide film was less than 1%. Advantageously, $Al_2O_3$ is thermodynamically stable and tends not to cause oxidation of the adjacent metal layers.

EXAMPLE 2

The Deposition of Copper Oxide by ALD and a Reducing Method

The deposition of copper oxide by ALD and its subsequent reduction to copper metal is described in Finnish patent application no. FI20001163, filed May 15, 2000, now abandoned, PCT application number FI01/00473, filed May 15, 2001 and U.S. patent application Ser. No. 09/975,466, filed Oct. 9, 2001, the disclosures of which are included herein by reference.

A. Reduction of CuO with Methanol Vapor

A substrate comprising a copper oxide layer is loaded into the reaction chamber of an Eagle 10™ reactor, commercially available from ASM Japan. The reaction chamber is evacuated to vacuum and heated to 360° C. The pressure of the reaction chamber is adjusted to about 5–10 mbar with flowing nitrogen gas.

Methanol vapor is mixed with nitrogen gas, introduced to the reaction chamber and contacted with the substrate.

Excess methanol and reaction by-products are purged from the reaction chamber by flowing nitrogen gas.

B. Reduction of CuO with Ethanol Vapor

A substrate comprising a copper oxide layer is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Ethanol vapor is mixed with nitrogen gas, introduced to the reaction chamber and contacted with the substrate.

Excess ethanol and reaction by-products are purged from the reaction chamber by flowing nitrogen gas.

C. Reduction of CuO with 2-Propanol Vapor

A substrate comprising a copper oxide layer is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

2-propanol (also known as isopropanol) vapor is mixed with nitrogen gas, introduced to the reaction chamber and contacted with the substrate.

Excess 2-propanol and reaction by-products are purged from the reaction chamber by flowing nitrogen gas.

D. Reduction of CuO with tert-Butanol Vapor

A substrate comprising a copper oxide layer is loaded into the reaction chamber of an Eagle 10™ reactor. The reaction chamber is evacuated to vacuum and heated to greater than 385° C. The pressure of the reaction chamber is adjusted to about 5–10 mbar with flowing nitrogen gas.

Tert-butanol vapor is mixed with nitrogen gas, introduced to the reaction chamber and contacted with the substrate.

Excess tert-butanol and reaction by-products are purged from the reaction chamber by flowing nitrogen gas.

E. Reduction of CuO with Butyraldehyde Vapor

A substrate comprising a copper oxide layer is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Butyraldehyde vapor is mixed with nitrogen gas, introduced to the reaction chamber and contacted with the substrate.

Excess butyraldehyde and reaction by-products are purged from the reaction chamber by flowing nitrogen gas.

F. Reduction of CuO with Formic Acid Vapor

A substrate comprising a copper oxide layer is loaded into the reaction chamber of an Eagle 10™ reactor. The reaction chamber is evacuated to vacuum and heated to 310° C. The pressure of the reaction chamber is adjusted to about 5–10 mbar with flowing nitrogen gas.

Formic acid vapor is mixed with nitrogen gas, introduced to the reaction chamber and contacted with the substrate.

Excess formic acid and reaction by-products are purged from the reaction chamber by flowing nitrogen gas.

G. Reduction of CuO with Acetic Acid Vapor

A substrate comprising a copper oxide layer is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Acetic acid vapor is mixed with nitrogen gas, introduced to the reaction chamber and contacted with the substrate.

Excess acetic acid and reaction by-products are purged from the reaction chamber by flowing nitrogen gas.

H. Reduction of CuO with Plasma

A substrate comprising a copper oxide layer is loaded into the reaction chamber of an Eagle 10™ reactor. The reaction chamber is evacuated to vacuum and heated to approximately 300° C. The pressure of the reaction chamber is adjusted to about 5–10 mbar with flowing gas comprising hydrogen.

A plasma discharge or glow is created in the gas by the application of RF power. Plasma treatment is continued for approximately 2 minutes.

Reaction byproducts are purged from the reaction chamber with flowing nitrogen gas.

I. Reduction of CuO with Hydrogen

A substrate comprising a copper oxide layer is loaded into the reaction chamber of an Eagle 10™ reactor. The reaction chamber is evacuated to vacuum, heated to approximately 500° C. and the pressure of the reaction chamber is adjusted to about 5–10 mbar with flowing nitrogen gas.

Hydrogen gas is mixed with nitrogen gas (10% hydrogen by volume), introduced to the reaction chamber and contacted with the substrate.

Reaction byproducts are purged from the reaction chamber with flowing nitrogen gas.

EXAMPLE 3

The Deposition of Cobalt Oxide by ALD and a Reducing Method

Cobalt oxide (CoO) was deposited by ALD from alternating pulses of Co(thd)$_3$ and an ozone/oxygen mixture. A substrate was loaded into the reaction space of an ALD reactor. The reaction space was evacuated with a vacuum pump. The reaction space temperature was adjusted to 250° C. Cobalt source gas Co(thd)$_3$ was heated to 110° C. in a source container inside the ALD reactor. Alternating pulses of cobalt source gas and the ozone/oxygen mixture were introduced into the reaction space. The ozone/oxygen mixture had a flow rate of about 100 std. cm$^3$/min during the ozone pulse.

The pulsing cycle consisted of the following steps:
Co(thd)$_3$ pulse 1.5 s
N$_2$ purge 2.0 s
O$_3$ pulse 3.0 s
N$_2$ purge 2.0 s.

The pulsing cycle was repeated 2000 times. The resulting thin film had a thickness of about 64 nm and a growth rate of about 0.03 nm/cycle. Stoichiometry of the CoO film was determined by energy dispersive x-ray spectroscopy (EDS).

CoO was reduced into Co metal by treating the samples with ethanol vapor for 10 minutes at 400° C. Energy dispersive x-ray spectroscopy (EDS) results showed that the reduced film was pure cobalt; the oxygen content of the cobalt film was below the detection limit of the EDS. The above process was successfully employed to deposit layers of 200 nm to metal. It will be understood that, for layers in the range desired for the preferred magnetic devices, the reduction temperature can be lowered, e.g., to the 300° C. process temperature of the ALD processes.

Regarding the ferromagnetic layers, reduction of metal oxide into metal was tested with cobalt oxide, as described above in Example 3. Reduction of nickel oxide into nickel metal is also possible. The reduction of platinum oxide into platinum metal is also possible for the production of a pinning layer. Reduction of iron oxide into iron metal requires quite strong reducing agent. A relatively good correlation between theoretical calculations (Free Gibb's energy of the reaction, calculated with HSC Chemistry® for Windows, Outokumpu Research Oy, Finland) and experiments for the reduction process has been observed.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method of fabricating a magnetic memory cell, comprising:
providing a substrate on which the magnetic memory cell is formed;
depositing a first ferromagnetic layer;
depositing a dielectric layer over the first ferromagnetic layer; and
depositing a second ferromagnetic layer over the dielectric layer, wherein depositing at least one of the first or second ferromagnetic layers comprises:
depositing a metal oxide by multiple ALD cycles, wherein the metal oxide is not reduced to elemental metal in each ALD cycle; and
after completing the multiple ALD cycles, subsequently reducing the metal oxide to element metal.

2. The method of claim 1, wherein the magnetic memory cell comprises a magnetic tunneling junction (MTJ).

3. The method of claim 1, wherein the magnetic memory cell is a magnetic random access memory cell.

4. The method of claim 1, wherein the dielectric layer is deposited by ALD.

5. The method of claim 1, wherein the dielectric layer comprises aluminum oxide.

6. The method of claim 1, wherein the first ferromagnetic layer is deposited by ALD.

7. The method of claim 6, wherein depositing the first ferromagnetic layer by ALD comprises depositing a metal oxide by ALD and subsequently reducing the metal oxide to elemental metal.

8. The method of claim 7, wherein the elemental metal comprises cobalt.

9. The method of claim 1, wherein depositing the second ferromagnetic layer comprises an ALD process.

10. The method of claim 9, wherein depositing the second ferromagnetic layer comprises depositing a metal oxide by ALD and subsequently reducing the metal oxide to elemental metal.

11. The method of claim 10, wherein the elemental metal comprises cobalt.

12. The method of claim 1, wherein the first ferromagnetic layer has a lower magnetic permeability than the second ferromagnetic layer.

13. The method of claim 1, wherein the first ferromagnetic layer is thinner than the second ferromagnetic layer.

14. A method of fabricating a magnetic memory cell, comprising:
providing a substrate on which the magnetic memory cell is formed;
depositing a first magnetic layer on the substrate;
forming a dielectric layer over the first magnetic layer;
depositing a metal oxide layer comprising a magnetic metal over the dielectric layer by multiple atomic layer deposition (ALD) cycles, wherein the metal oxide is not reduced to elemental metal in each ALD cycle; and
after completing the multiple ALD cycles, reducing the metal oxide layer to a magnetic elemental metal layer.

15. A method of fabricating a magnetic memory cell, comprising:
provproviding a substrate on which the magnetic memory cell is formed;
forming a first magnetic layer on the substrate;
depositing a first non-magnetic metal oxide layer over the first magnetic layer;
converting the first non-magnetic metal oxide layer to a first non-magnetic metal layer;
depositing an insulating layer on the first non-magnetic metal layer;
depositing a second non-magnetic metal oxide layer by multiple atomic layer deposition (ALD) cycles, wherein the metal oxide is not reduced to elemental metal in each ALD cycle;
after the multiple ALD cycles, converting the second non-magnetic metal oxide layer to a second non-magnetic metal layer; and
depositing a second magnetic layer on the second non-magnetic metal layer.

16. The method of claim 15, wherein the first non-magnetic metal oxide layer is deposited by ALD.

17. The method of claim 15, wherein the first non-magnetic metal oxide layer and the second non-magnetic metal oxide layer are converted to the first and second non-magnetic metal layers by reducing the metal oxide to elemental metal.

18. The method of claim 17, wherein reducing comprises exposing the metal oxide layer to a chemical selected from the group consisting of hydrogen, hydrogen-rich radicals, carbon monoxide, alcohol vapor, aldehyde vapor and carboxylic acid vapor.

19. The method of claim 15, wherein the first and the second non-magnetic metal oxide layers comprise copper oxide.

20. A method of fabricating a magnetic nanolaminate structure, comprising:
depositing a plurality of metal oxide layers on a substrate by multiple atomic layer deposition (ALD) cycles; wherein the metal oxide layers are not reduced to elemental metal in each ALD cycle; and wherein at least two of the metal oxide layers differ in composition; and
after the multiple ALD cycles, subsequently converting at least one of the plurality of metal oxide layers to an elemental metal layer, wherein at least one of the metal oxide and elemental metal layers is magnetic.

21. The method of claim 20, wherein the magnetic nanolaminate structure is part of a magnetic memory device.

22. The method of claim 20, wherein the magnetic nanolaminate structure is part of a read-head.

23. The method of claim 20, wherein the magnetic nanolaminate structure comprises a magnetic tunneling junction.

24. The method of claim 20, wherein the magnetic nanolaminate structure is part of a spin valve transistor.

25. The method of claim 20, wherein depositing the plurality of metal oxide layers comprises, in order: depositing a first metal oxide layer, depositing an insulating layer, and depositing a second metal oxide layer, wherein each of the first and second metal oxide layers either comprise a magnetic metal or is a magnetic oxide.

26. The method of claim 20, wherein depositing the plurality of metal oxide layers comprises, in order: depositing a first metal oxide layer, depositing a first non-magnetic metal oxide layer, depositing an insulating layer, depositing a second non-magnetic metal oxide layer, and depositing a second metal oxide layer, wherein each of the first and second metal oxide layers either comprise a magnetic metal or is a magnetic oxide.

27. The method of claim 20, wherein converting comprises reducing a metal oxide layer to elemental metal.

28. The method of claim 27, wherein reducing comprises contacting the layer with a compound selected from the group consisting of hydrogen, hydrogen-rich radicals, carbon monoxide, alcohol vapor, aldehyde vapor and carboxylic acid vapor.

29. The method of claim 20, wherein at least one of the metal oxide layers comprises a ferromagnetic oxide selected from the group consisting of magnetite ($Fe_3O_4$), $CrO_2$, manganite perovskites doped with alkaline earth metals and metal oxide superlattices.

30. The method of claim 20, wherein the magnetic nanolaminate comprises at least one magnetic metal selected from the group consisting of iron (Fe), cobalt (Co) and nickel (Ni).

31. The method of claim 20, wherein the magnetic nanolaminate comprises at least one non-magnetic metal.

32. The method of claim 31, wherein the non-magnetic metal is copper.

33. A method of fabricating a sensing element of a read-head comprising:
providing a substrate on which the sensing element is to be formed;
depositing a first ferromagnetic layer by an atomic layer deposition (ALD) process comprising:
depositing a metal oxide by multiple ALD cycles, wherein the metal oxide is not reduced to elemental metal in each ALD cycle; and
after completing the multiple ALD cycles, subsequently reducing the metal oxide to elemental metal to form the first ferromagnetic layer;
depositing a conductive layer over the first ferromagnetic layer; and
depositing a second ferromagnetic layer over the conductive layer.

34. The method of claim 33, wherein the conductive layer is deposited by atomic layer deposition.

35. The method of claim 33, wherein the second ferromagnetic layer is deposited by atomic layer deposition.

36. The method of claim 33, wherein the first ferromagnetic layer comprises NiFe and the second ferromagnetic layer comprises Co.

37. The method of claim 33, wherein the conductive layer comprises Cu.

38. A method of fabricating a magnetic memory cell, comprising:
providing a substrate on which the magnetic memory cell is formed;
depositing a first magnetic layer;
depositing a dielectric layer over the first magnetic layer; and
depositing a second ferromagnetic layer over the dielectric layer, wherein depositing at least one of the first or second ferromagnetic layers comprises:
depositing a metal oxide by multiple ALD cycles, wherein the metal oxide is not reduced to elemental metal in each ALD cycle; and
after completing the multiple ALD cycles, subsequently reducing the metal oxide to elemental metal.

39. The method of claim 33, wherein the elemental metal comprises cobalt.

* * * * *